(12) United States Patent
Choi et al.

(10) Patent No.: US 7,883,929 B2
(45) Date of Patent: Feb. 8, 2011

(54) METHODS OF MANUFACTURING NON-VOLATILE MEMORY DEVICES BY IMPLANTING METAL IONS INTO GRAIN BOUNDARIES OF VARIABLE RESISTANCE LAYERS

(75) Inventors: Byung-Yong Choi, Seoul (KR); Choong-Ho Lee, Seongnam-si (KR); Kyu-Charn Park, Byeongtaek-si (KR)

(73) Assignee: Samsung Electronics Co., Ltd. (KR)

( * ) Notice: Subject to any disclaimer, the term of this patent is extended or adjusted under 35 U.S.C. 154(b) by 253 days.

(21) Appl. No.: 12/035,169

(22) Filed: Feb. 21, 2008

(65) Prior Publication Data
US 2008/0203377 A1    Aug. 28, 2008

(30) Foreign Application Priority Data
Feb. 27, 2007    (KR) .................... 10-2007-0019826

(51) Int. Cl.
*H01L 31/00*    (2006.01)
(52) U.S. Cl. .................... 438/85; 438/3; 438/95; 438/104; 257/E21.294
(58) Field of Classification Search .................... 438/85, 438/95, 104, 3; 257/E21.294

See application file for complete search history.

(56) References Cited

U.S. PATENT DOCUMENTS

| 6,849,891 B1 | 2/2005 | Hsu et al. |
| 7,282,759 B2 | 10/2007 | Kim et al. |
| 2004/0159867 A1* | 8/2004 | Kinney et al. ............... 257/295 |
| 2009/0067213 A1* | 3/2009 | Buynoski et al. ............ 365/148 |

FOREIGN PATENT DOCUMENTS

| KR | 10-2006-0083368 A | 7/2006 |
| KR | 10-2006-0108960 A | 10/2006 |

* cited by examiner

*Primary Examiner*—Thanhha Pham
(74) *Attorney, Agent, or Firm*—Myers Bigel Sibley & Sajovec, P.A.

(57) ABSTRACT

Integrated circuit nonvolatile memory devices are manufactured by forming a variable resistance layer on an integrated circuit substrate. The variable resistance layer includes grains that define grain boundaries between the grains. Conductive filaments are formed along at least some of the grain boundaries. Electrodes are formed on the variable resistance layer. The conductive filaments may be formed by implanting conductive ions into at least some of the grain boundaries. Moreover, the variable resistance layer may be a variable resistance oxide of a metal, and the conductive filaments may be the metal. Related devices are also disclosed.

10 Claims, 16 Drawing Sheets

METHODS OF MANUFACTURING NON-VOLATILE MEMORY DEVICES BY IMPLANTING METAL IONS INTO GRAIN BOUNDARIES OF VARIABLE RESISTANCE LAYERS

CROSS-REFERENCE TO RELATED APPLICATION

This application claims the benefit under 35 U.S.C. § 119 to Korean Patent Application No. 10-2007-0019826, filed on Feb. 27, 2007, the disclosure of which is hereby incorporated herein by reference in its entirety as if set forth fully herein.

FIELD OF THE INVENTION

The present invention relates to methods of manufacturing integrated circuit non-volatile memory devices. More particularly, the present invention relates to methods of manufacturing integrated circuit non-volatile memory devices including a material whose resistance varies according to an applied voltage, and related devices.

BACKGROUND OF THE INVENTION

Generally, non-volatile memory devices may be classified as either floating-gate type memory devices or charge-trap type memory devices in accordance with a structure of a unit cell incorporated therein.

The unit cell of a typical floating-gate type non-volatile memory device includes a tunnel oxide layer, a floating gate, a dielectric layer and a control gate sequentially formed on a semiconductor substrate. The floating-gate type non-volatile memory device may store information by charging/discharging electrons into/out of the floating gate.

In contrast, the unit cell of a typical charge-trap type non-volatile memory device includes a tunnel insulation layer including silicon oxide, a charge-trapping layer such as silicon nitride, a blocking layer such as silicon oxide, and an electrode such as doped polysilicon sequentially formed on a semiconductor substrate. In the typical charge-trap type non-volatile memory device, information may be programmed in the charge-trap type non-volatile memory device by storing charges in the charge-trapping layer between the electrode and the semiconductor substrate. Information may be erased from the charge-trap type non-volatile memory device by discharging charges from the charge-trapping layer.

Recently, resistive memory devices with high capacity, capable of operating at a relatively low voltage have been developed. Resistive memory devices are also referred to as "resistive RAMS" or "RRAMS". The RRAM takes advantage of controllable resistance changes in thin films of variable resistance material, such as thin binary metal oxide films. Integrated circuit resistive memory devices are described, for example, in U.S. Pat. No. 6,849,891 to Hsu et al., and U.S. Pat. No. 7,282,759 to Kim et al.

The resistance node of a resistive non-volatile memory device may vary from a higher resistance state to a lower resistance state according to a voltage applied to both terminals of the resistance node. A conductive path in the shape of a filament may be form on the resistance node, and a current flowing through the resistance node may flow via the conductive path in the shape of the filament. Unfortunately, however, the resistance nodes may have different resistances. Further, performing several processes for changing the resistance at the resistance node may deteriorate reproducibility of manufacturing the non-volatile memory device.

SUMMARY OF THE INVENTION

Integrated circuit nonvolatile memory devices may be fabricated according to some embodiments of the present invention, by forming a variable resistance layer on an integrated circuit substrate. The variable resistance layer includes a plurality of grains therein that define grain boundaries between the grains. Conductive filaments are formed along at least some of the grain boundaries. Electrodes are formed on the variable resistance layer. In some embodiments, the conductive filaments are formed by implanting conductive ions into at least some of the grain boundaries. Moreover, in other embodiments, the variable resistance layer comprises a variable resistance oxide of a metal, and the conductive filaments comprise the metal.

Analogous devices may be provided according to other embodiments of the present invention. For example, an integrated circuit non-volatile memory device according to some embodiments of the present invention includes an integrated circuit substrate and variable resistance layer on the integrated circuit substrate. The variable resistance layer includes a plurality of grains therein that define grain boundaries between the grains. A conductive filament is provided along at least some of the grain boundaries, and a plurality of electrodes is provided on the variable resistance layer. The variable resistance layer may comprise a variable resistance oxide of a metal, and the conductive filaments may comprise the metal.

According to other embodiments of the present invention, a non-volatile memory device is manufactured by forming a recess in an integrated circuit substrate. A variable resistance material layer is formed on surfaces of the recess. The variable resistance material layer includes a plurality of grains therein that define grain boundaries between the grains. Metal ions are implanted into the variable resistance material layer to form metal filaments along at least some of the grain boundaries in the variable resistance material layer. A lower electrode is formed on the variable resistance material layer in the recess. A dielectric layer is formed on the substrate, the variable resistance material layer and the lower electrode. An upper electrode is formed on the dielectric layer. The upper electrode overlaps the lower electrode and the variable resistance material layer.

In some embodiments of the present invention, to form the lower electrode, a conductive layer that completely fills up the recess may be formed. The conductive layer and the variable resistance material layer may be planarized until the substrate is exposed.

In some embodiments of the present invention, the variable resistance material layer may include a binary metal oxide. Examples of the metal oxide may include nickel oxide, zirconium oxide, titanium oxide, niobium oxide, lead oxide, tantalum oxide, etc. These materials may be used alone or in various combinations/subcombinations thereof.

In some embodiments of the present invention, the method further includes forming impurity regions at an upper portion of the substrate adjacent to the upper electrode.

In some embodiments of the present invention, the metal oxide may include nickel oxide and the metal ion may include a nickel ion.

According to other embodiments of the present invention, a non-volatile memory device is manufactured by forming an isolation layer pattern extending in a first direction in an integrated circuit substrate to define an active region and an isolation region of the substrate. The active region of the substrate is partially removed to form a plurality of recesses. A variable resistance material layer is formed on a surface of the recess. Metal ions are implanted into the variable resistance material layer to form a metal filament along a grain boundary in the variable resistance material layer. A lower electrode is formed extending in a second direction substantially perpendicular to the first direction on the variable resistance material layer. The lower electrode fills up the recess. A dielectric layer is formed on the substrate, the variable resistance material layer and the lower electrode. An upper electrode is formed on the dielectric layer. The upper electrode overlaps the lower electrode and the variable resistance material layer.

In some embodiments of the present invention, a non-volatile memory device having a NAND type may be manufactured.

According to other embodiments of the present invention, a non-volatile memory device is manufactured by implanting impurities into a surface of an integrated circuit substrate to form first and second impurity regions. The substrate is partially etched to form recesses making contact with side portions of the first and second impurity regions. A variable resistance material layer pattern that fills up the recesses is formed. Metal ions are implanted into the variable resistance material layer pattern to form a metal filament along a grain boundary in the variable resistance material layer pattern. A gate oxide layer and a gate electrode are formed on the substrate.

In some embodiments of the present invention, to form the first and second impurity regions, a first mask pattern may be formed on the substrate. The first mask pattern may selectively expose portions of the substrate where the first and the second impurity regions are to be formed. The impurities may be implanted into the substrate using the first mask pattern as an ion implantation mask.

In some embodiments of the present invention, prior to forming the first mask pattern, the method may further include forming an ion implantation sacrificial layer on the substrate.

In some embodiments of the present invention, to form the recesses, a protection layer that covers a portion of the substrate between the first mask patterns may be formed. The first mask pattern may be isotropically etched to form a second mask pattern that has a width substantially smaller than a width of the first mask pattern. The substrate may be partially etched using the second mask pattern as an etching mask.

In some embodiments of the present invention, an upper surface of the protection pattern may be substantially higher than an upper surface of the first mask pattern.

In some embodiments of the present invention, to form the variable resistance material layer pattern, a variable resistance material layer that completely fills up the recess may be deposited. The variable resistance material layer may be planarized to expose upper faces of the protection pattern and the second mask pattern. The variable resistance material layer may be partially removed by an etch-back process until an upper surface of the variable resistance material layer becomes substantially the same level as the surface of the substrate.

In some embodiments of the present invention, to form the gate oxide layer and the gate electrode, the second hard mask pattern may be removed to expose an upper surface of the substrate between the protection patterns. A gate oxide layer may be formed conformally on surfaces of the protection pattern, the variable resistance material layer pattern and the substrate. A conductive layer may be formed on the gate oxide layer. The conductive layer may fill up a space between the protection patterns. The conductive layer may be planarized to expose an upper face of the protection pattern.

In some embodiments of the present invention, prior to forming the gate oxide layer and the gate electrode, the method may further include removing the second hard mask pattern to expose the substrate and the variable resistance material layer pattern.

In some embodiments of the present invention, the variable resistance material layer pattern may include a metal oxide. Examples of the metal oxide may include nickel oxide, zirconium oxide, titanium oxide, niobium oxide, lead oxide, tantalum oxide, etc. These materials may be used alone or in various combinations/subcombinations thereof.

In some embodiments of the present invention, the metal oxide may include nickel oxide and the metal ion may include a nickel ion.

According to various embodiments of the present invention, the metal filaments can be formed uniformly along the grain boundaries in the variable resistance material layer pattern by a metal ion implantation. Thus, resistance distribution of the variable resistance material layer according to the voltage applied to thereto may be more uniform. Therefore, operation characteristics of a resistive non-volatile memory device may be improved.

BRIEF DESCRIPTION OF THE DRAWINGS

The above and other features and advantages of the present invention will become more apparent by describing in detailed embodiments thereof with reference to the accompanying drawings, in which.

DETAILED DESCRIPTION

Figure 1:
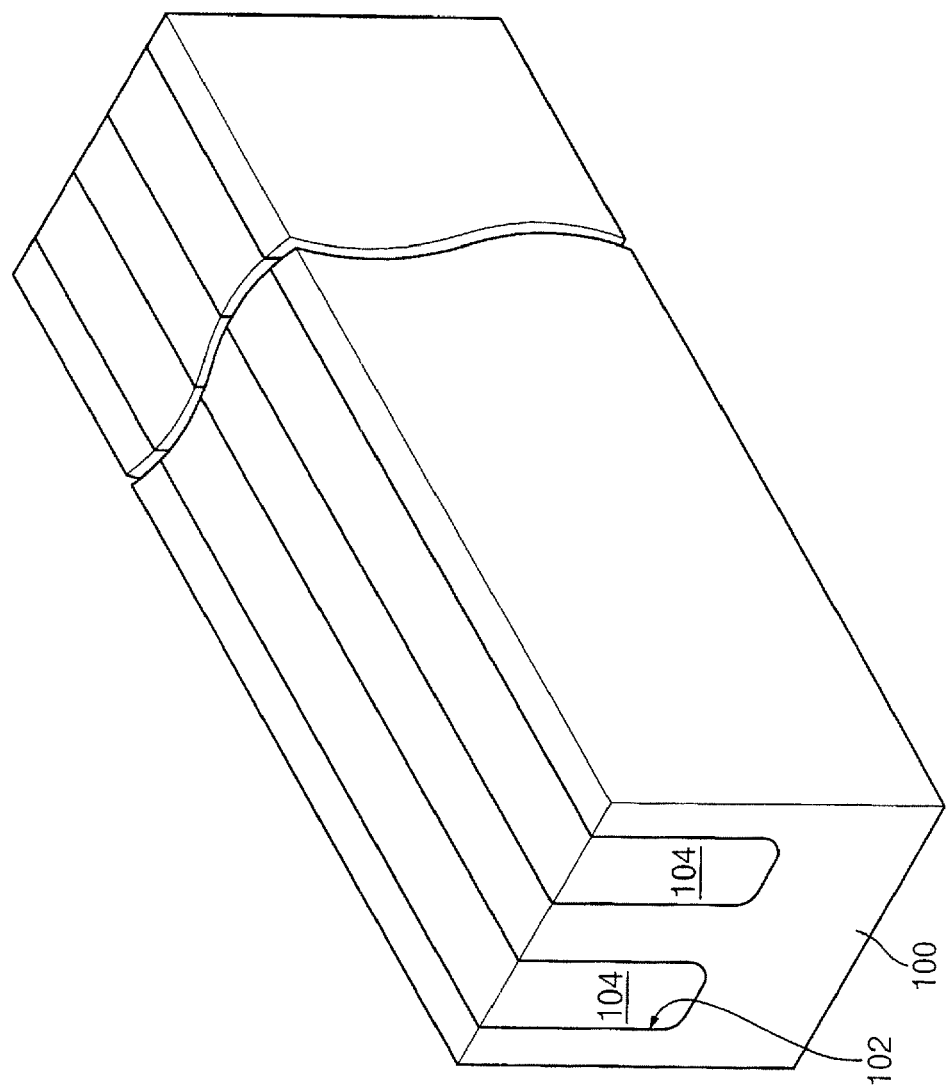
FIGS. 1 to 8 are a perspective view and cross-sectional views illustrating methods of manufacturing a non-volatile memory and a device so manufactured in accordance with first embodiments of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, a variable resistance material may also be referred to as a "resistive material" or a "resistant material", consistent with the use of the term "resistive RAM" in the art. Thus, it will be understood that the terms "resistant material" or "resistive material" also mean a material having a controllable variable resistance property.

FIGS. 1 to 8 are a perspective view and cross-sectional views illustrating methods of manufacturing a non-volatile memory and devices so manufactured in accordance with first embodiments of the present invention.

Although the non-volatile memory device in accordance with first embodiments as described below has a cell array of a NAND type, embodiments of the present invention may be employed in another type of the non-volatile memory device, such a NOR flash memory device. FIGS. 2 to 8 are cross-sectional views illustrating active regions taken along a first direction.

Referring to FIG. 1, an isolation layer pattern 104 is formed on an integrated circuit substrate 100 that may include a semiconductor material such as single crystalline silicon, or the like. For example, the isolation layer pattern 104 may be formed by an isolation process such as a shallow trench isolation (STI) process. The isolation layer pattern 104 may have a linear shape extending in a first direction. Accordingly, an active region and an isolation region defined by the isolation layer pattern 104 may have linear shapes extending in the first direction. The active region and the isolation region are disposed in an alternating arrangement.

In some embodiments of the present invention, a first pad oxide layer and a first silicon nitride layer are formed on the substrate 100. The first silicon nitride layer and the first pad oxide layer are partially etched to form a first hard mask that selectively exposes a portion of the substrate 100 corresponding to the isolation region.

The exposed portion of the substrate 100 is partially removed by an etching process using the first hard mask as an etching mask to form a trench 102. An oxide layer may be formed on a bottom and a sidewall of the trench 102 in order to cure damages to the bottom and the sidewall of the trench 102 generated during a formation of the trenches 102. The oxide layer may be formed by oxidizing a portion of the substrate 100 exposed through the bottom and the sidewall of the trench 102.

The trenches 102 are filled up with an insulation material to form an insulation layer on the first hard mask. The insulation layer may be formed by a chemical vapor deposition (CVD) process, a plasma enhanced chemical vapor deposition (PECVD) process, a high-density plasma chemical vapor deposition (HDP-CVD) process, etc. The insulation layer may be formed using oxide such as silicon oxide.

The insulation layer is planarized until the first hard mask is exposed so as to form the isolation layer pattern 104 that fills up the trench 102. After the first hard mask is removed, the substrate 100 is divided into the active region and the isolation region.

Figure 2:
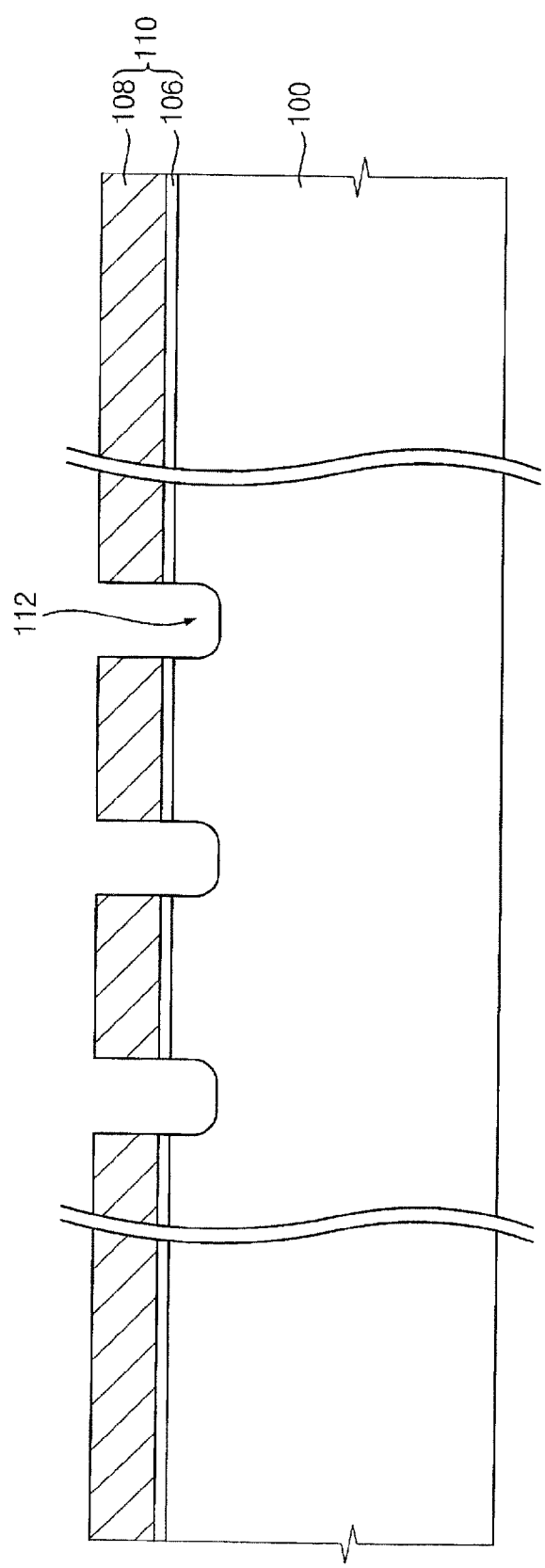

Referring FIG. 2, a second pad oxide layer and a second silicon nitride layer are formed on the substrate 100 including the isolation layer pattern 104.

The second silicon nitride layer and the second pad oxide layer are partially etched to form a second hard mask 110 including a second pad oxide layer pattern 106 and a second silicon nitride layer pattern 108 sequentially stacked on the substrate 100. The second hard mask 110 exposes a portion of the active region of the substrate 100 where a recess 112 is located. Here, the recess 112 may serve as a region where a variable resistance material layer pattern and a lower electrode of a unit cell are formed. In some embodiments of the present invention, a plurality of the recesses 112 may be spaced apart from one another by a predetermined distance. Further, the recess 112 may be formed to partially expose a sidewall of the isolation layer pattern 104.

In some embodiments of the present invention, the isolation layer pattern 104 may have a linear shape extending in the first direction, and the second hard mask 110 may have a linear shape extending in a second direction substantially perpendicular to the first direction.

The exposed portion of the substrate 110 is partially removed by an etching process using the second hard mask as an etching mask to form the recess 112. Here, while the substrate 100 is partially removed, the isolation layer pattern 104 may be hardly removed.

Figure 3:
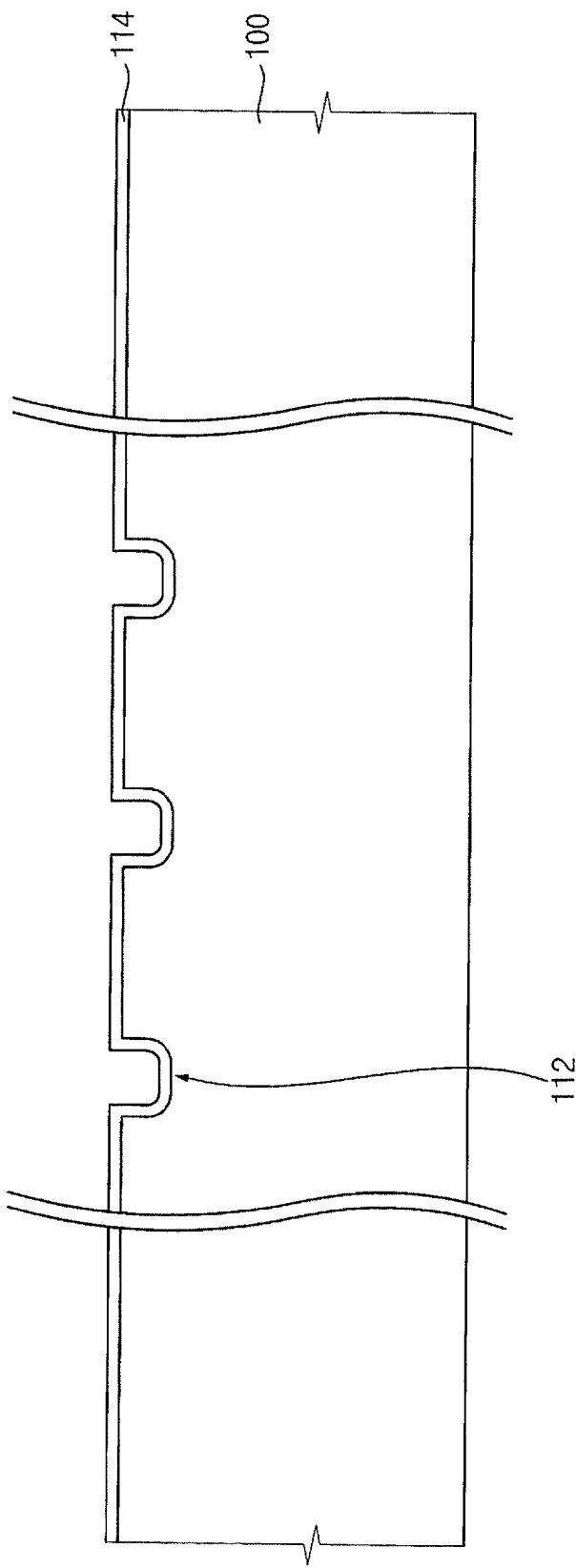

Referring to FIG. 3, the second hard mask 110 is removed to expose an upper face of the substrate 100 including the recess 112. In some embodiments of the present invention, the second hard mask 110 may be removed by a wet etching process so that damage to the upper face of the substrate 100 may be reduced.

A variable resistance material layer 114 is formed conformally on a bottom and a sidewall of the recess 112 and the upper face of the substrate 100. The variable resistance material layer 114 may not completely fill up the recess 112, and may have a uniform thickness along a profile of an inner wall of the recess 112.

The variable resistance material layer 114 is formed using a material whose resistance varies according to an applied voltage. For example, the variable resistance material layer 114 may be formed using metal oxide. Examples of the metal oxide may be nickel oxide (Ni2O3), zirconium oxide (ZrO2), titanium oxide (TiO2), niobium oxide (Nb2O5), lead oxide (PbO), tantalum oxide (Ta2O5), etc. These materials may be used alone or in various combinations/subcombinations thereof.

The variable resistance material layer 114 is formed conformally to have a uniform thickness on the bottom and the sidewall of the recess 112 and the upper face of the substrate 100. For example, the variable resistance material layer 114 may be formed by a metal organic chemical vapor deposition (MOCVD) process or an atomic layer deposition (ALD) process for good step coverage characteristics. Alternatively, the variable resistance material layer 114 may be formed by a physical vapor deposition (PVD) process.

Figure 9:
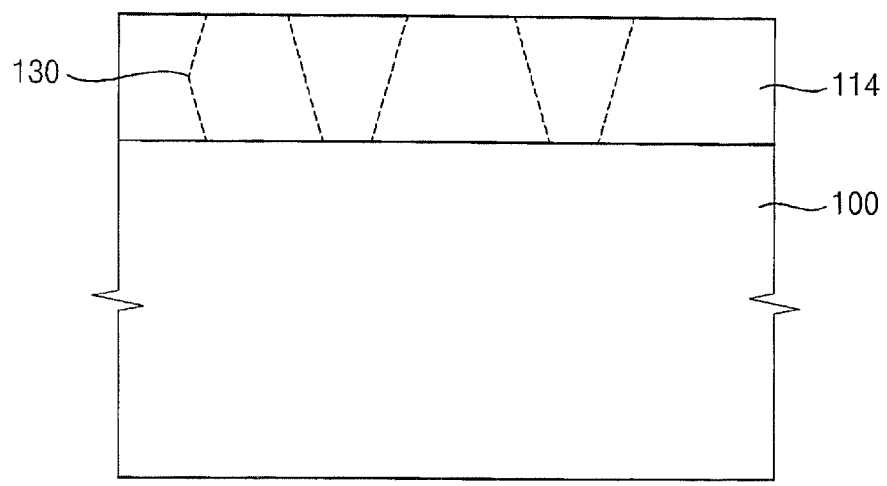
FIG. 9 is an enlarged cross-sectional view illustrating a variable resistance material layer formed on a substrate.

FIG. 9 is an enlarged view illustrating the variable resistance material layer formed on the substrate. As illustrated in FIG. 9, grain boundaries 130 are irregularly formed in the variable resistance material layer 114 that is formed by a deposition process.

Figure 4:
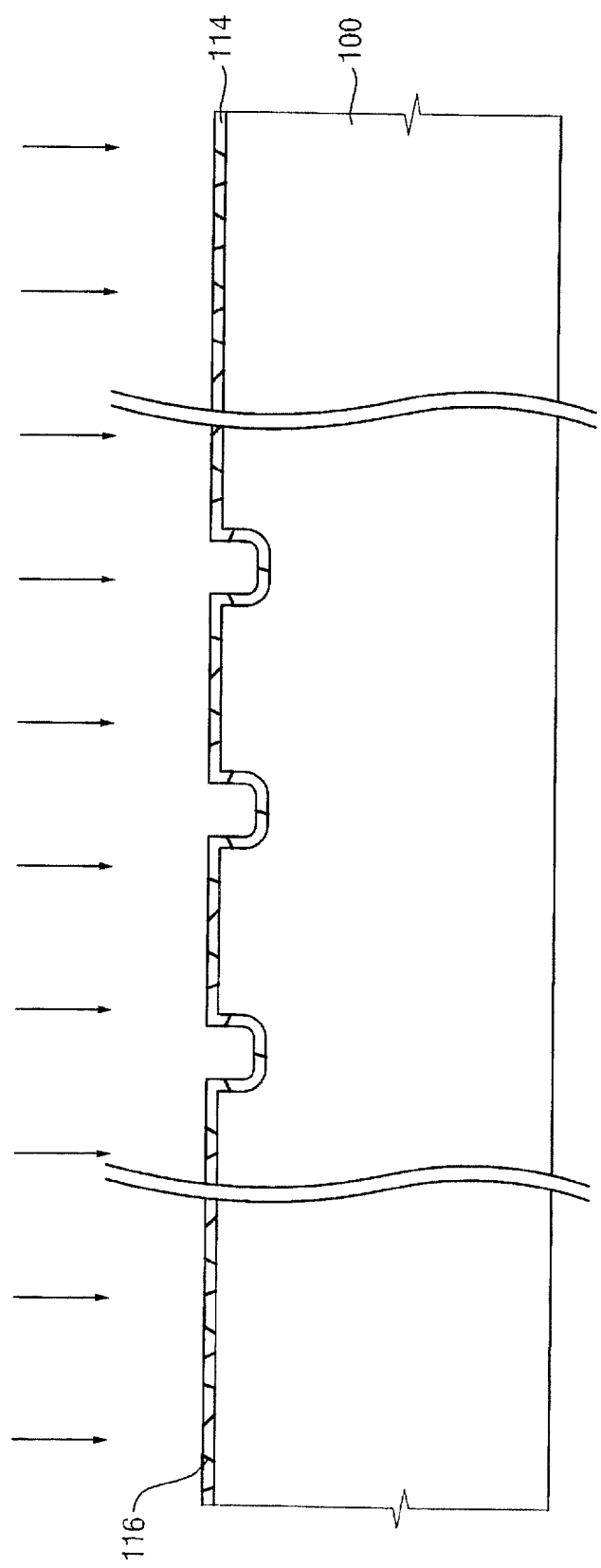

Referring to FIG. 4, metal ions are implanted into the variable resistance material layer 114 to form a metal filament 116 along the grain boundary in the variable resistance material layer 114. When the variable resistance material layer 114 includes nickel oxide (Ni2O3), nickel ions may be implanted into the variable resistance material layer 114. Alternatively, when the variable resistance material layer 114 includes zirconium oxide (ZrO2), zirconium ions may be implanted into the variable resistance material layer 114.

Figure 10:
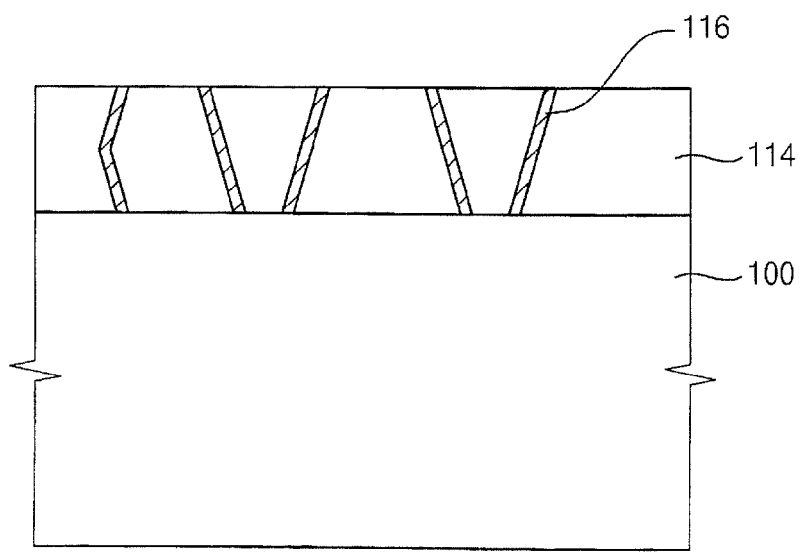
FIG. 10 is an enlarged view illustrating the variable resistance material layer after implanting the metal ions into the variable resistance material layer.

FIG. 10 is an enlarged view illustrating the variable resistance material layer after implanting the metal ions into the variable resistance material layer.

Referring to FIG. 10, when the metal ions are implanted into the variable resistance material layer 114, metal filaments 116 are formed along the disorderly grain boundary 130. Because concentration of the implanted metal ions may be controlled during the ion implantation process, the metal ions of the variable resistance material layer 114 may have a uniform concentration across an entire region of the substrate. For example, an implantation concentration of the metal ions in the ion implantation process may range from about $10^{14}$ atoms/m$^2$ to about $10^{14}$ atoms/m$^2$. The variable resistance material layer 114 has a regular crystal structure having a uniform concentration of metal atoms per unit volume from a disorderly crystal structure by the formation of the metal filament 116. Accordingly, electrical properties of the variable resistance material layer 114 may be improved due to the transformation of the crystal structure of the variable resistance material layer 114. For example, when a voltage is applied between both ends of the variable resistance material layer formed on an entire region of the substrate, resistance distribution of the variable resistance material layer may be uniform. Accordingly, the resistance difference between the variable resistance material layers of adjacent cells may be reduced and prevented. Further, a reproducibility of resistance according to the voltage applied between both ends of the variable resistance material layer may be improved.

Figure 5:
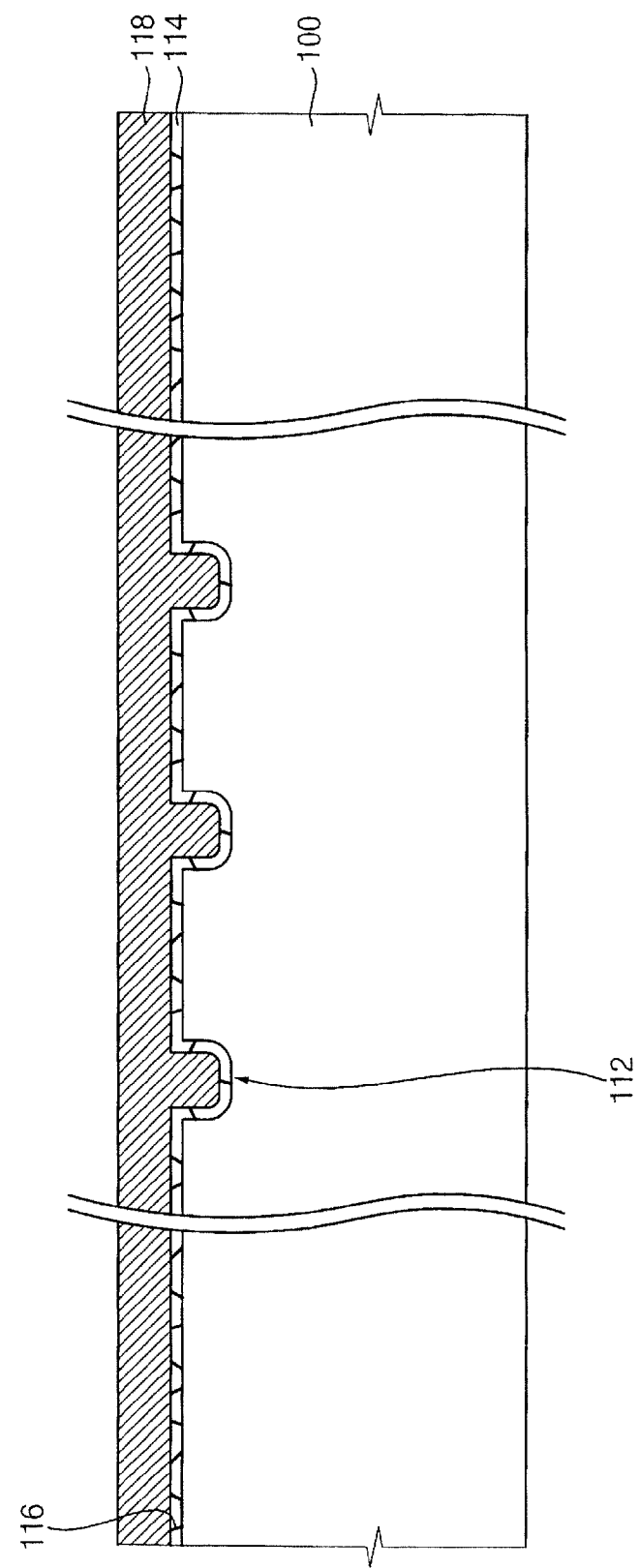

Referring to FIG. 5, the recess 112 is completely filled up with a conductive material to form a conductive layer 118 for forming a lower electrode. The conductive layer 118 may be formed using polysilicon doped with impurities, a metal, nanocrystalline silicon, etc. For example, the conductive layer 116 may be formed using polysilicon having good step coverage characteristics.

Figure 6:
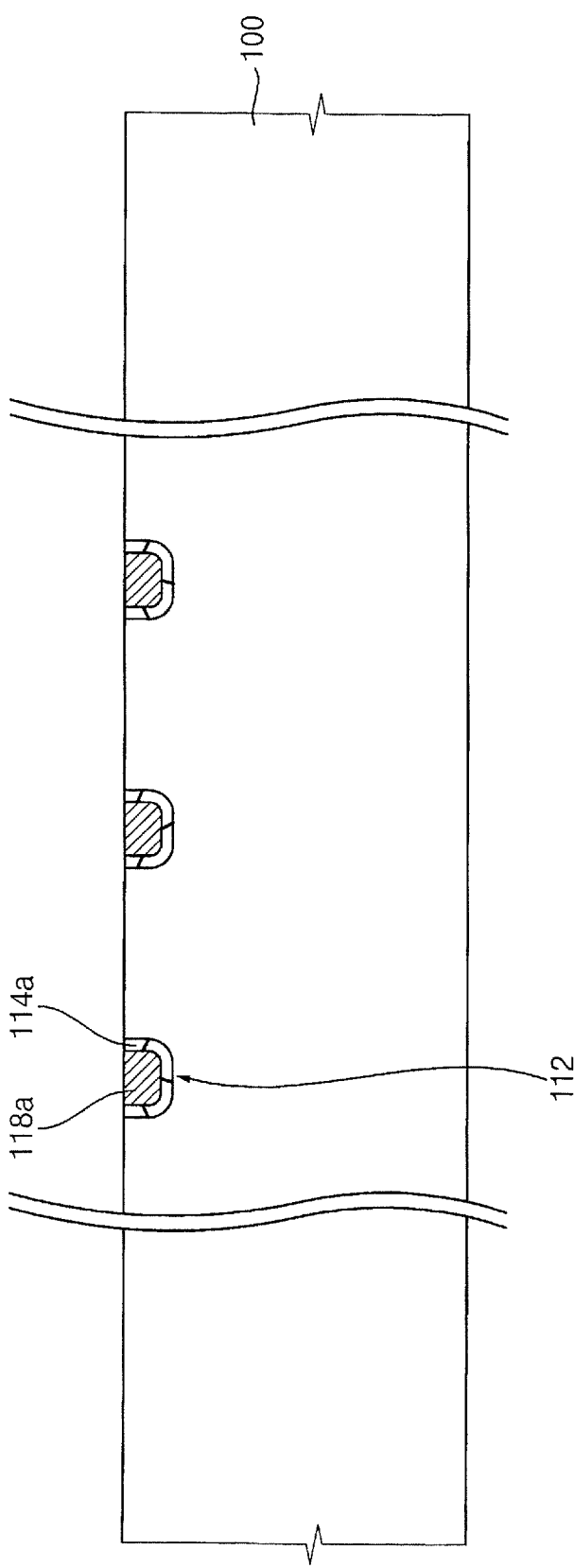

Referring to FIG. 6, the conductive layer 118 and the variable resistance material layer 114 are polished until the upper face of the substrate 100 is exposed to form the variable resistance material layer pattern 114*a* and the lower electrode 118*a*. The variable resistance material layer pattern 114*a* may surround a bottom and a sidewall of the lower electrode 118*a*. Upper faces of the lower electrode 118*a* and the variable resistance material layer pattern 114*a* may be formed to be on substantially the same level as that of the substrate 100.

Figure 7:
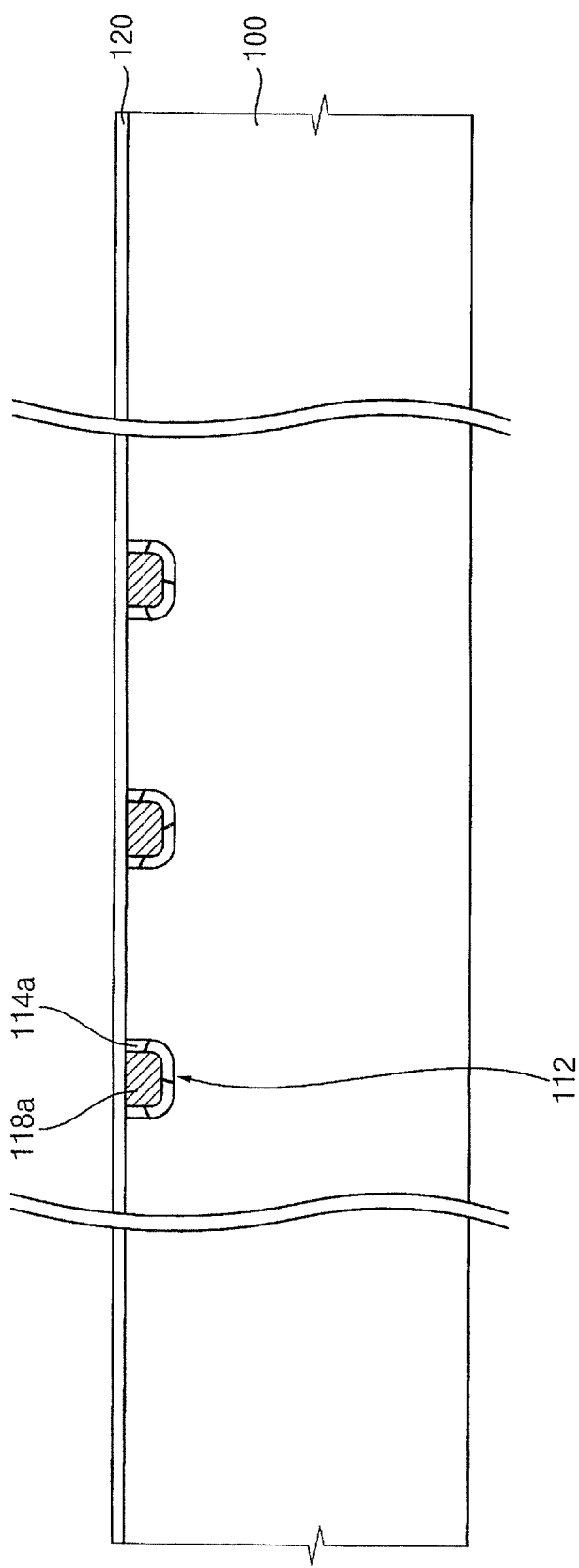

Referring to FIG. 7, a dielectric layer 120 is formed on the substrate 100, the lower electrode 118*a* and the variable resistance material layer pattern 114*a*.

In some embodiments of the present invention, the dielectric layer 120 may be formed by sequentially forming a silicon oxide layer, a silicon nitride layer and a silicon oxide layer. For example, the silicon oxide layers and the silicon nitride layer may be formed by a CVD process. Alternatively, the dielectric layer 120 may be formed using metal oxide having a dielectric constant higher than that of silicon oxide. The metal oxide may be formed by a CVD process and/or an ALD process.

Examples of the metal oxide may be tantalum oxide (Ta2O5), titanium oxide (TiO2), hafnium oxide (HfO2), zirconium oxide (ZrO2), hafnium silicate (HfSixOy), zirconium silicate (ZrSixOy), hafnium silicon oxynitride (HfSixOyNz), zirconium silicon oxynitride (ZrSixOyNz), aluminum oxide (Al2O3), aluminum oxynitride (AlxOyNz), hafnium aluminate (HfAlxOy), yttrium oxide (Y2O3), cerium oxide (CeO2), indium oxide (InO3), lanthanum oxide (LaO2), strontium titanium oxide (SrTiO3), lead titanium oxide (PbTiO3), strontium ruthenium oxide (SrRuO3), calcium ruthenium oxide (CaRuO3), etc. These may be used alone or in various combinations/subcombinations thereof.

Figure 8:
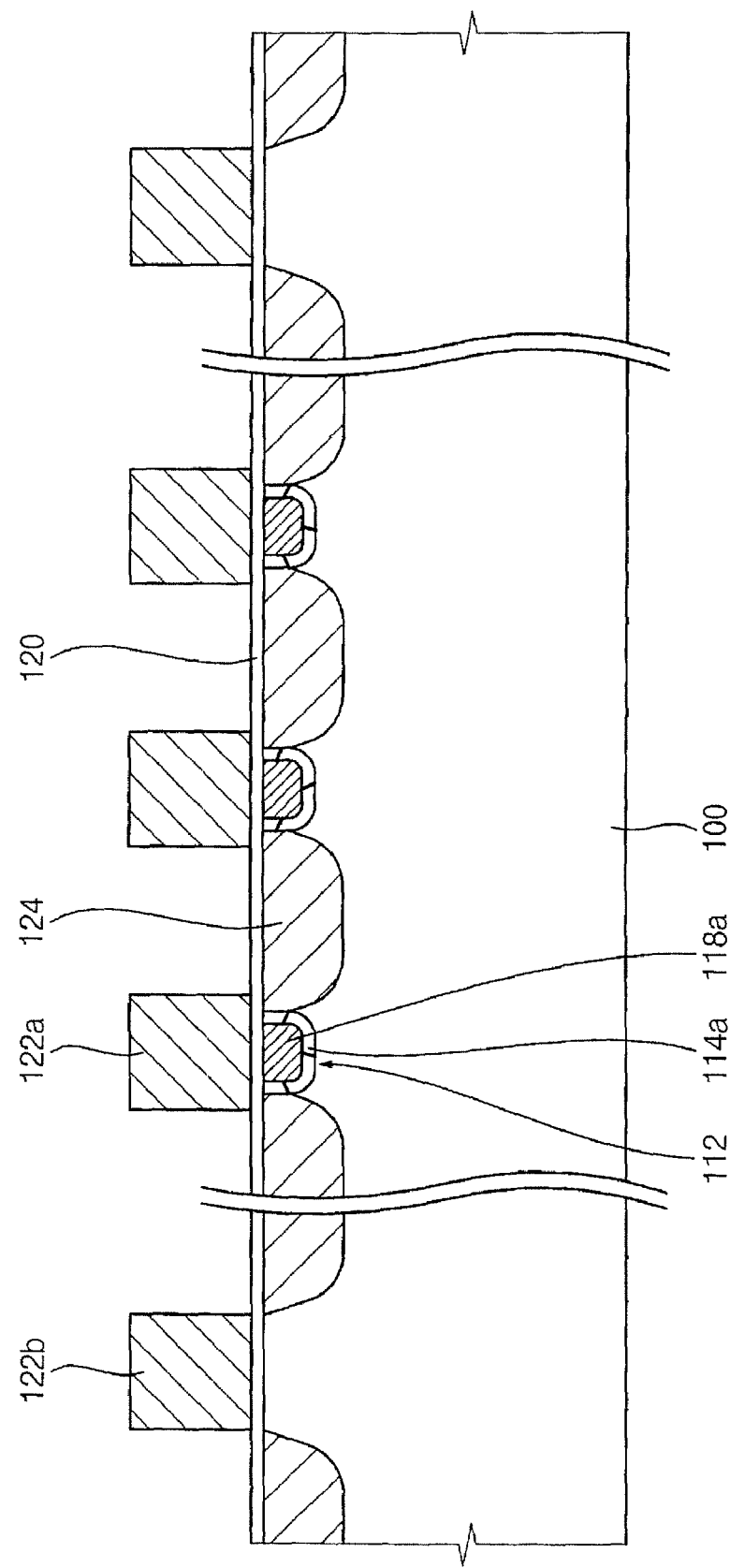

Referring to FIG. 8, a conductive layer for forming an upper electrode is formed on the dielectric layer 120. The conductive layer for forming the upper electrode may be formed using polysilicon doped with impurities, a metal, etc.

A third hard mask is formed on the conductive layer, and the conductive layer is partially removed by an etching process using the third hard mask as an etching mask to form an upper electrode 122a.

The upper electrode 122a overlaps the lower electrode 118a and the variable resistance material layer pattern 114a. The isolation layer pattern 104 may have a linear shape extending in the first direction, and the upper electrode 122a may have a linear shape extending in the second direction that is substantially perpendicular to the first direction. Thus, the upper electrode 122a may control a plurality of the lower electrodes 118a and a plurality of the variable resistance material layer patterns 114a that are disposed in the second direction.

When the upper electrode 122a is formed by an etching process over the recess 112, an electrode pattern 122b may be formed by the etching process on a portion of the dielectric layer 120 where the recess 112 is not formed. The electrode pattern 122b may serve as a gate electrode of a metal oxide semiconductor (MOS) transistor for controlling unit cell strings.

N-type impurities are implanted into an upper portion of the substrate 100 exposed by the upper electrode 122a and the gate electrode 112b to form impurity regions 124. The impurity regions 124 may make contact with a sidewall of the variable resistance material layer pattern 114a.

Hereinafter, a method of operating a non-volatile memory device having a cell array of a NAND type in accordance with first embodiments of the present invention will be described.

Figure 11:
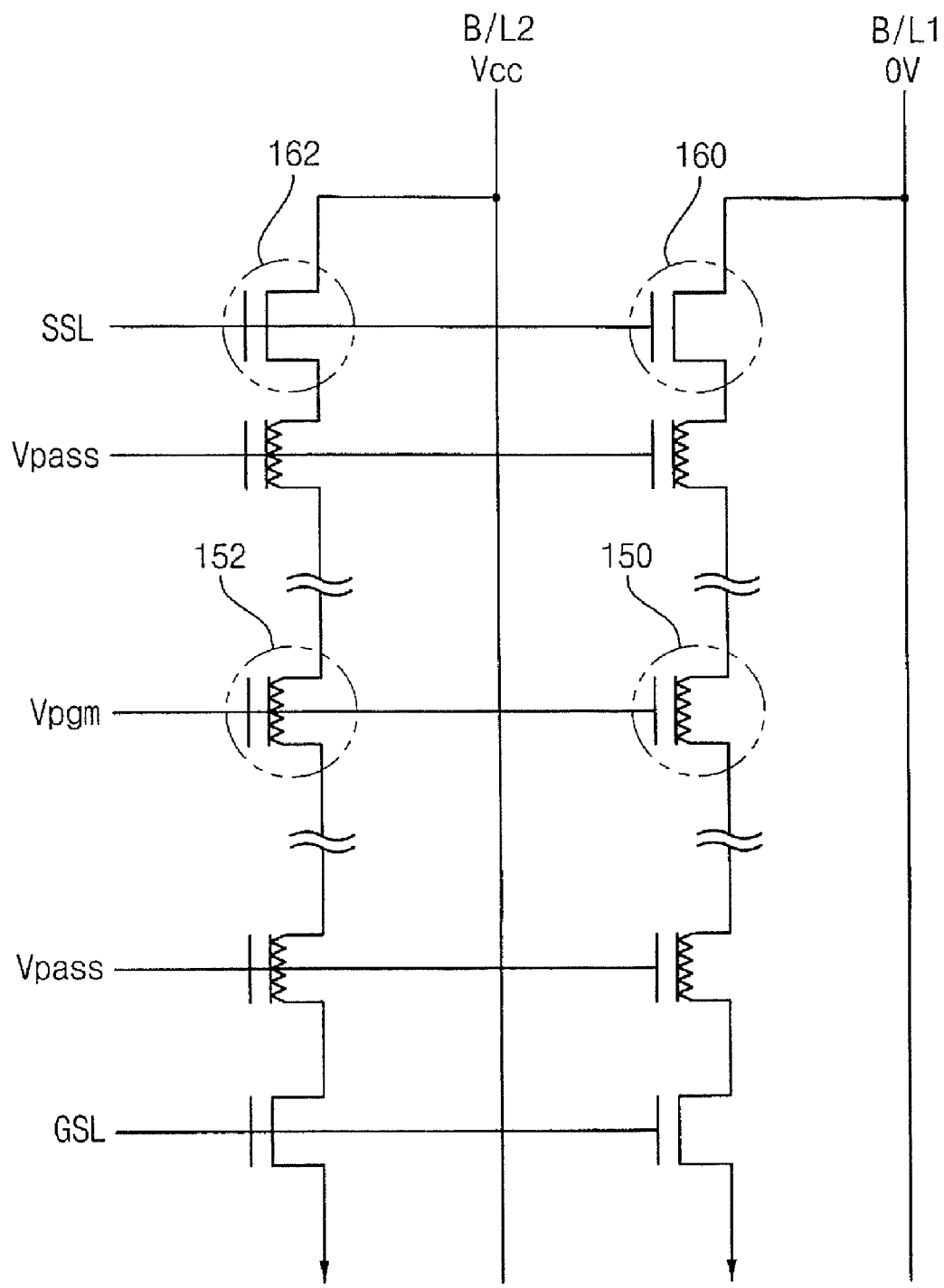
FIG. 11 is an equivalent circuit diagram of a cell string of a non-volatile memory device in FIG. 1.

FIG. 11 is an equivalent circuit diagram of a cell string of the non-volatile memory device in FIG. 1.

Referring to FIG. 11, a NAND flash memory device has a string structure in which a plurality of cells is electrically connected to one another in series, and adjacent strings have an upper electrode (that is, a word line) in common. Therefore, a programming inhibition voltage (Vinhibit) is applied to adjacent unselected cells when data is programmed in a selected cell, so that data may not be programmed in the unselected cells.

For example, a programming voltage (Vpgm) is applied to an upper electrode of a selected cell 150 so that data may be programmed in the selected cell 150. Here, the programming voltage is a voltage that can transform the variable resistance material layer so that the variable resistance material layer has a relatively low resistance A portion of a bulk substrate under the selected cell 150 is maintained at a voltage of about 0 V. In order that the portion of the bulk substrate under the selected cell 200 may be maintained at the voltage of about 0 V, a voltage of about 0 V is applied to an impurity region (B/L 1) of a selection transistor 160 that is electrically connected to the selected cell 150. A pass voltage (Vpass) to form a channel at a portion of the bulk substrate under a recess is applied to upper electrodes of the adjacent cells that are electrically connected to the selection transistor 160 in series.

Resistance of the variable resistance material layer pattern varies in accordance with a voltage applied to the upper electrode. When the variable resistance material layer pattern has a relatively low resistance, a direct current path may be generated between the impurity regions. Thus, a relatively large current flows greatly through the channel region according to the applied voltage. Alternatively, when the variable resistance material layer pattern has a relatively high resistance, a direct current path may be not generated between the impurity regions. Thus, an amount of current flowing through the channel region according to the applied voltage is reduced compared to the variable resistance material layer pattern having the relatively low resistance.

In some embodiments of the present invention, since the metal filament is formed in the variable resistance material layer pattern, resistance distribution of the variable resistance material layer according to the voltage applied to the upper electrode may be more uniform.

In the meantime, since the selected upper electrode has a linear shape extending in the second direction, the selected upper electrode controls corresponding lower electrodes and variable resistance material layer patterns that are arranged linearly in the second direction. Accordingly, when a programming voltage is applied to the upper electrode of the selected cell 150, unselected cells 152 adjacent to the selected cell 150 in the second direction may be also programmed. Therefore, a programming inhibition voltage is applied to the unselected cells 152 so that the unselected cells 152 may not be programmed.

For example, a power supply voltage (Vcc) is applied to an impurity region (B/L2) of a selection transistor 212 that is electrically connected to the unselected cells 152. A pass voltage (Vpass) to form a channel at a portion of the bulk substrate under a recess is applied to the upper electrode of the adjacent cells that are electrically connected to the selection transistor 162 in series. In this case, a portion of the bulk substrate under the unselected cell 152 has a voltage lower than the power supply voltage (Vcc). An electric potential difference between both ends of the variable resistance material layer pattern is hardly generated even though the programming voltage (Vpgm) is applied to the upper electrode because the programming voltage has been applied to the portion of the substrate under the unselected cell 152. Therefore, data may not be programmed in the unselected cell 152.

As mentioned above, when the variable resistance material layer pattern has a relatively low resistance, an amount of current flowing through the channel region according to the applied voltage may be relatively large. Alternatively, when the variable resistance material layer pattern has a relatively high resistance, an amount of current flowing through the channel region according to the applied voltage is reduced compared to the variable resistance material layer pattern having the relatively low resistance.

Methods of operating the NAND flash memory device in accordance with some embodiments of the present invention may be similar to that of the conventional NAND flash memory device, and thus detailed descriptions about the methods of programming data will be omitted herein for brevity.

FIGS. 12 to 21 are cross-sectional views illustrating methods of manufacturing a non-volatile memory and devices so manufactured in accordance with second embodiments of the present invention.

Figure 12:
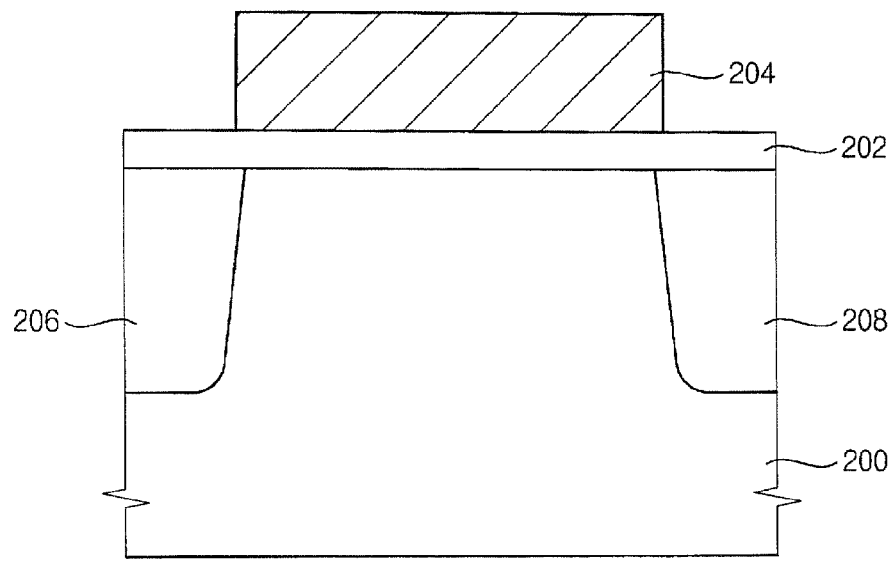
FIGS. 12 to 21 are cross-sectional views illustrating methods of manufacturing a non-volatile memory and a device so manufactured in accordance with second embodiments of the present invention.

Referring to FIG. 12, an integrated circuit such as a semiconductor substrate 200 is prepared. For example, the semiconductor substrate 100 may include single crystalline silicon.

A sacrificial layer 202 and a first hard mask layer are sequentially formed on the semiconductor substrate 200. The first hard mask layer is then patterned to form a first hard mask pattern 204 that exposes portions of the sacrificial layer 202 where a first impurity region 206 and a second impurity region 208 are to be formed.

Impurities are implanted into the semiconductor substrate 200 using the first hard mask pattern 204 as an ion implantation mask to form the first impurity region 206 and the second impurity region 208 in the semiconductor substrate 200. The sacrificial layer 202 may prevent the semiconductor substrate 200 from being damaged during the ion implantation process. In some embodiments of the present invention, the first impurity region 206 and the second impurity region 208 may be doped with n-type impurities.

Figure 13:
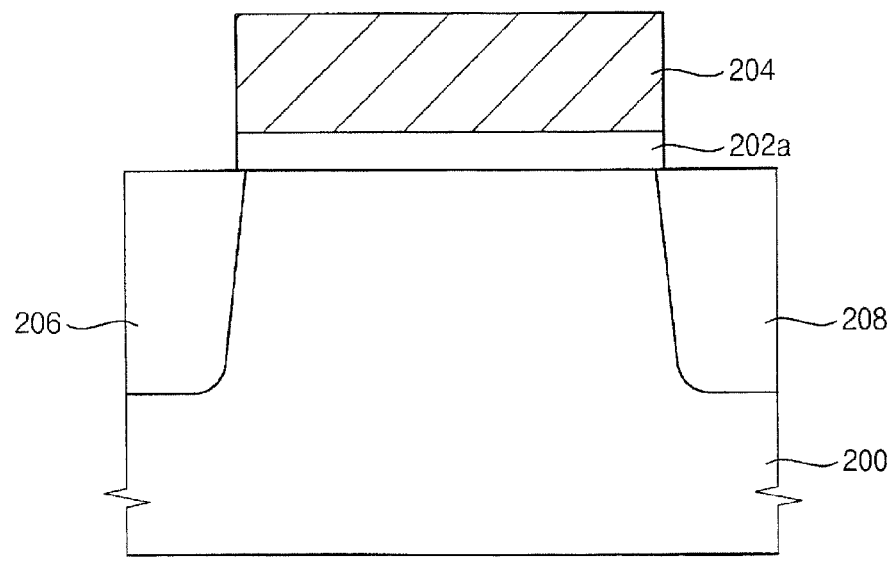

Referring to FIG. 13, the sacrificial layer 202 is partially removed using the first hard mask pattern 204 as an etching mask to form a sacrificial layer pattern 202a that selectively exposes the substrate 200. In some embodiments of the present invention, the sacrificial layer 202 may be removed by a wet etching process so that damages to the surfaces of the substrate 200 where the first and the second impurity regions 206 and 208 are formed are decreased.

Figure 14:
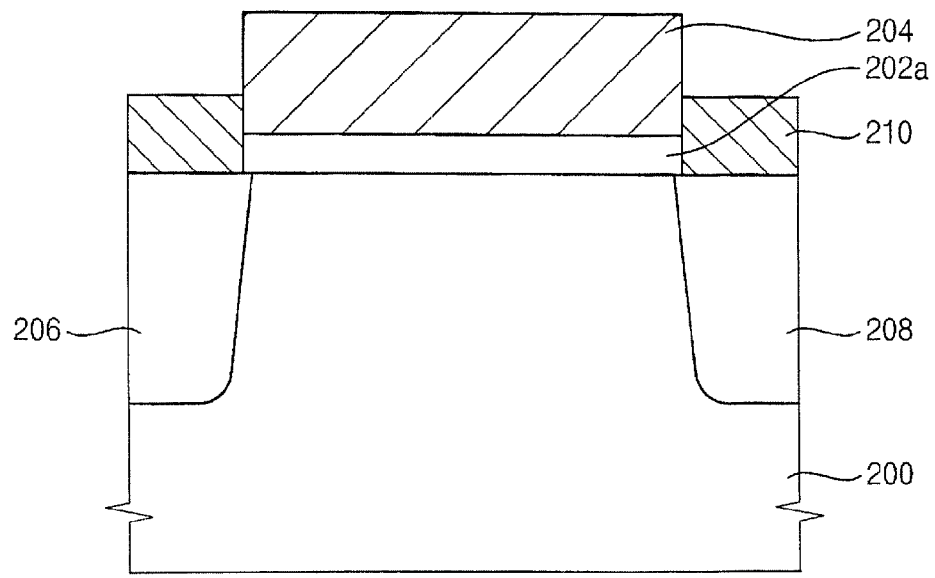

Referring to FIG. 14, a protection layer is formed on the exposed faces of the substrate 200 and the first hard mask pattern 204. In some embodiments of the present invention, the protection layer and the first hard mask pattern 204 may include different materials. For example, the protection layer may include a material having an etching selectivity with respect to the first hard mask pattern 204 for allowing the protection layer not to be etched while the first hard mask pattern 204 is etched.

The protection layer may then be planarized by a CMP process until upper faces of the first hard mask pattern 204 are exposed. Then, the protection layer separated by the planarizing process may be partially removed by an etch-back process to form a protection pattern 210 having an upper face substantially lower than that of the first hard mask pattern 204.

As mentioned above, after the protection layer may be planarized so that an upper face of the protection layer planarized by a planarizing process is substantially the same level as that of the first hard mask pattern 204, the protection layer may be partially removed by an etch-back process to form the protection pattern 210. Thus, the protection pattern 210 may have a uniform thickness relative to the upper faces of the substrate 200.

Alternatively, a process for planarizing the protection layer may be omitted for simplification of the manufacturing process. For example, a portion of the protection layer formed on the first hard mask pattern 204 may be removed by an etch-back process without planarizing the protection layer.

Figure 15:
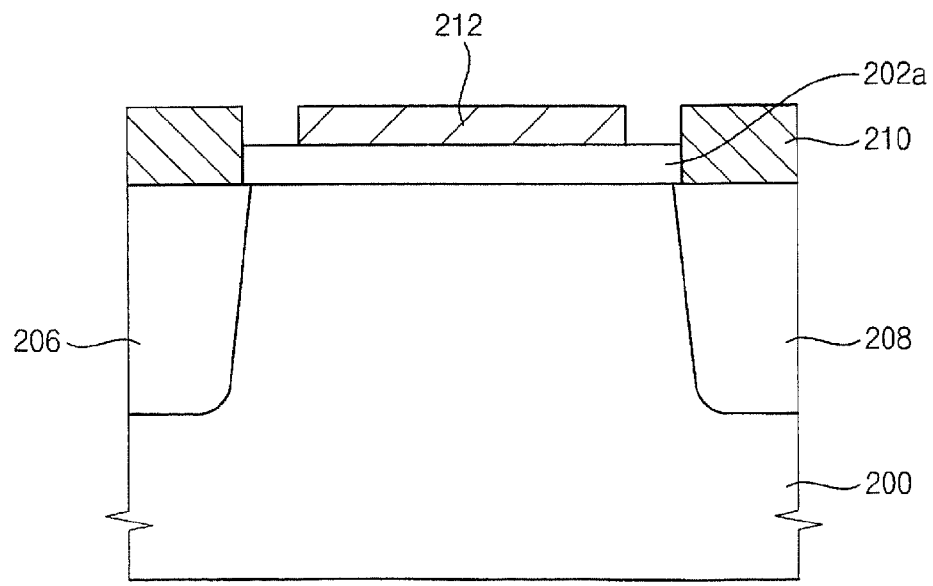

Referring to FIG. 15, the first hard mask pattern 204 is isotropically etched to form a second hard mask pattern 212 having a width substantially narrower than that of the first hard mask pattern 204. Thus, after the etching process, a space between the second hard mask pattern 204 and the protection pattern 210 is formed.

In a sequential process, portions of the substrate 200 exposed between the second hard mask pattern 212 and the protection pattern 210 may be etched to form a recess where a resistance material layer pattern is to be formed. Therefore, a spacing distance between the second hard mask pattern 212 and the protection pattern 210 defines a width of the variable resistance material layer pattern.

Figure 16:
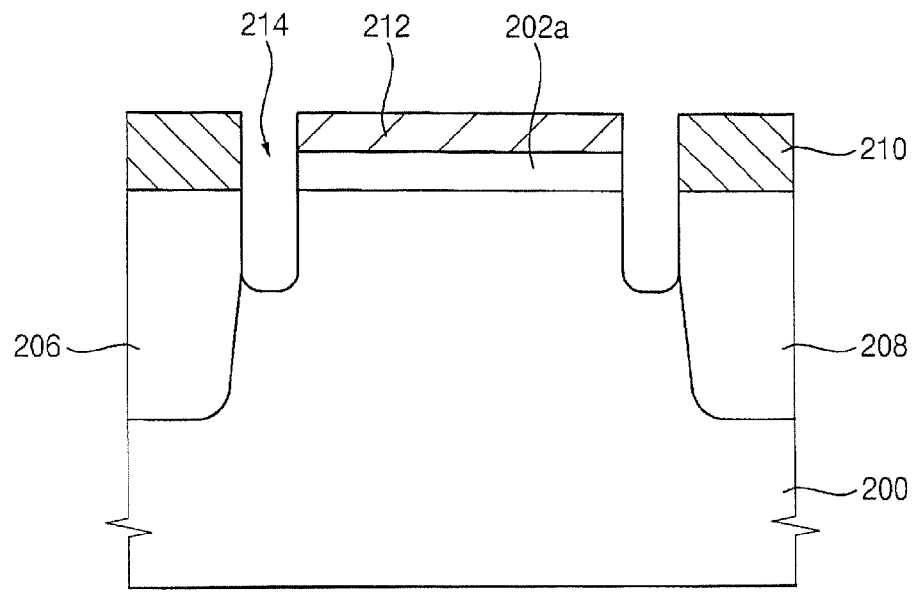

Referring to FIG. 16, the sacrificial layer pattern 202a and the substrate 200 are partially etched using the second hard mask pattern 212 and the protection pattern 210 as an etching mask to form a recess 214. The recess 214 makes contact with side portions of the first and the second impurity regions 206 and 208.

A thickness of the substrate 200 etched by the etching process defines that of the variable resistance material layer pattern. Therefore, the thickness of the variable resistance material layer pattern may be controlled by the etched thickness of the substrate 200.

In some embodiments of the present invention, the recess 214 may have a bottom surface substantially higher than that of the first and the second impurity regions 206 and 208. In other embodiments of the present invention, the bottom surface of the recess 214 may be on substantially the same level as that of the first and the second impurity regions 206 and 208.

Figure 17:
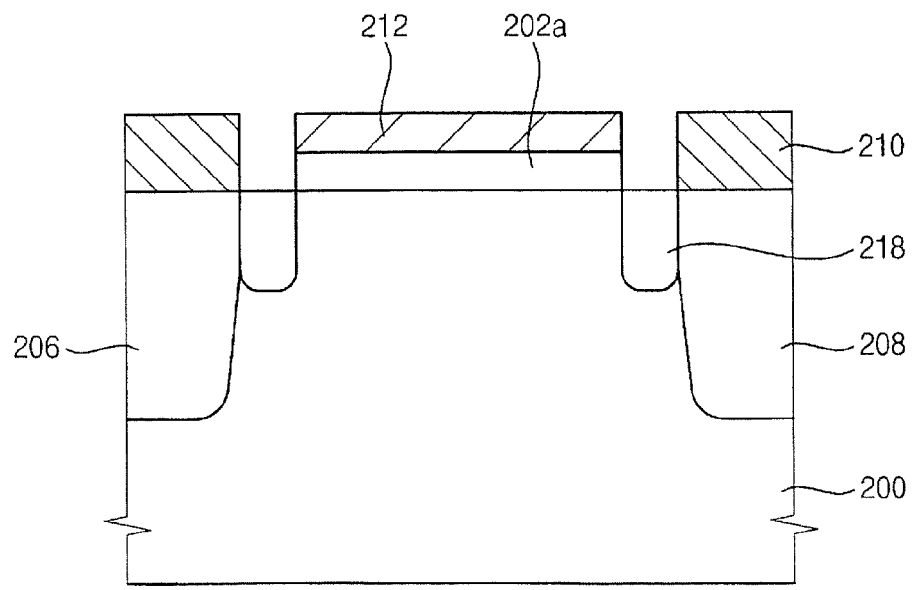

Referring to FIG. 17, the recess 214 is filled up with a variable resistance material to form a variable resistance material layer (not illustrated). The variable resistance material layer may include metal oxide. Examples of the metal oxide may be nickel oxide, zirconium oxide, titanium oxide, niobium oxide, lead oxide, tantalum oxide, etc. These may be used alone or in various combinations and subcombinations. Alternatively, the variable resistance material layer may have a stacked structure including a plurality of metal oxide layers sequentially stacked.

The variable resistance material layer is planarized by a CMP process until upper faces of the second hard mask pattern 204 and protection pattern 210 are exposed. Then, the variable resistance material layer separated by the planarizing process may be partially removed by an etch-back process to form a variable resistance material layer pattern 218. Upper faces of the variable resistance material layer pattern 218 and the substrate 200 may be positioned on a substantially same plane.

As mentioned above, the variable resistance material layer may be planarized so that an upper face of the variable resistance material layer planarized by a planarizing process is positioned on substantially the same level as that of the first hard mask pattern 204. Then, the variable resistance material layer may be partially removed by an etch-back process to form the variable resistance material layer pattern 218. Thus, the variable resistance protection pattern 218 may have a uniform thickness from entire upper faces of the substrate 200.

Alternatively, a process for planarizing the variable resistance material layer may be omitted for simplification of the manufacturing process. For example, portions of the variable resistance material layer formed on the second hard mask pattern 212 and the protection layer 210 may be removed by an etch-back process without planarizing the variable resistance material layer.

Figure 18:
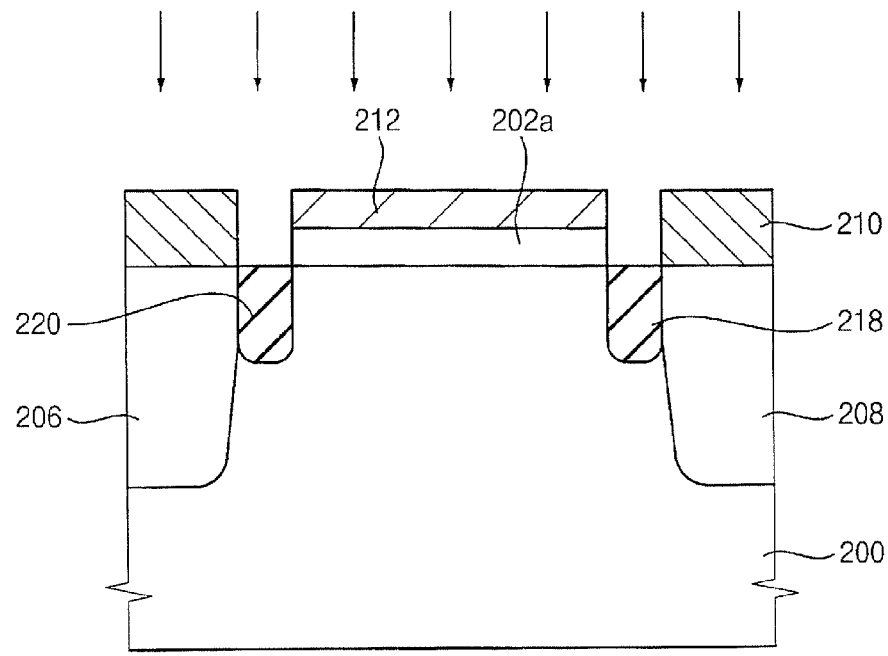

Referring to FIG. 18, metal ions are implanted into the variable resistance material layer pattern 218 to form metal filaments 220 along grain boundaries in the variable resistance material layer pattern 218.

For example, when the variable resistance material layer pattern 218 includes nickel oxide, nickel ions may be implanted into the variable resistance material layer pattern 218. Thus, a nickel filament is formed along the grain boundary in the variable resistance material layer pattern 218 by a nickel ion implantation process.

The protection pattern 210 and the second hard mask pattern 212 are formed on a portion of the substrate 200 except a portion where the variable resistance material layer pattern 218 is formed. Therefore, the metal ions may not be implanted into the first and the second impurity regions 206 and 208 by a metal implantation process.

Figure 19:
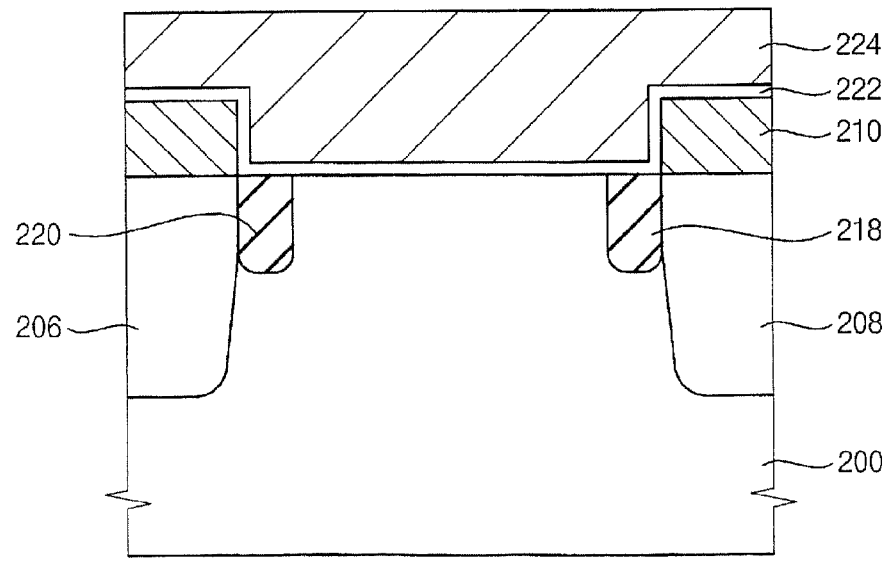

Referring to FIG. 19, the second hard mask pattern 212 and the sacrificial layer pattern 202a are removed by an etching process to form an opening between the protection patterns 210.

In some embodiments of the present invention, the second hard mask pattern 212 and the sacrificial layer pattern 202a may be removed by a wet etching process in order to reduce or prevent the substrate 200 from being damaged during the etching process.

A gate oxide layer 222 is formed conformally along profiles of upper faces of the protection pattern 210 and the substrate 200. In some embodiments, the gate oxide layer 222 may include a material such as silicon oxide. In other embodiments, the gate oxide layer 222 may include metal oxide having a dielectric constant higher than that of silicon oxide. Such a gate oxide layer 222 including metal oxide may be formed by an MOCVD process, an ALD process, or the like.

A gate conductive layer 224 for forming a gate electrode is formed on the gate oxide layer 224. The gate conductive layer 224 completely fills up the opening. In some embodiments, the gate conductive layer 224 may include polysilicon doped with impurities. In other embodiments, the gate conductive layer 224 may include a metal.

Figure 20:
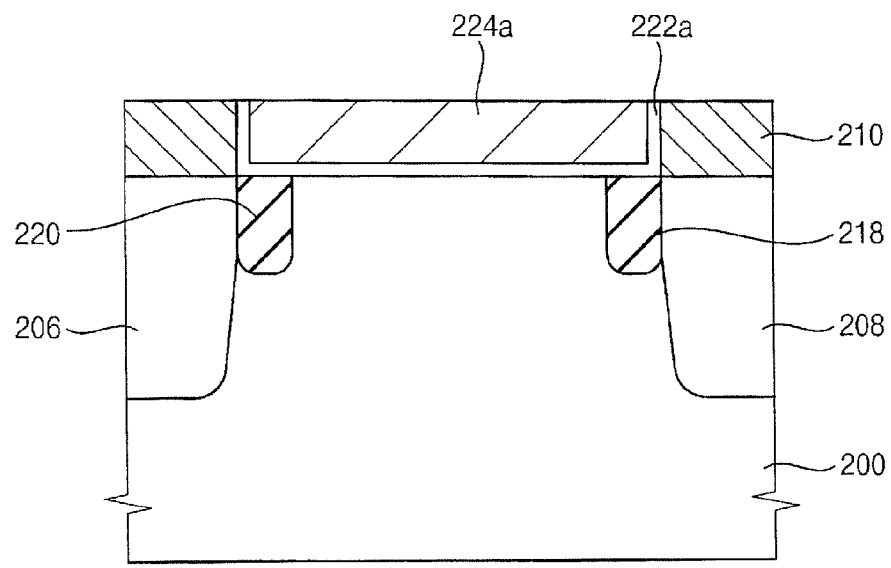

Referring to FIG. 20, the gate conductive layer 224 and the gate oxide layer 222 are partially removed until the upper faces of the protection pattern 210 are exposed to form a gate oxide layer pattern 222a and a gate electrode 224a. For example, the gate conductive layer 224 and the gate oxide layer 222 may be partially removed by a CMP process, an etch-back process, etc.

The gate oxide layer pattern 222a makes contact with a bottom and a sidewall of the gate electrode 224a. The gate oxide layer pattern 222a surrounds the bottom and the sidewall of the lower electrode 118a.

Figure 21:
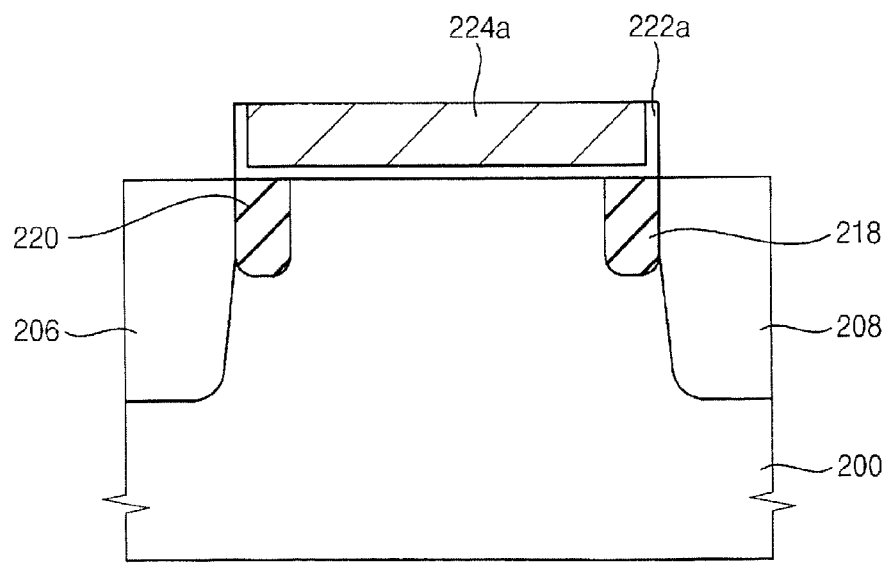

Referring to FIG. 21, the protection pattern 210 is removed to complete a non-volatile memory device. In some embodiments of the present invention, the protection pattern 210 may be removed by a wet etching process.

Figure 22:
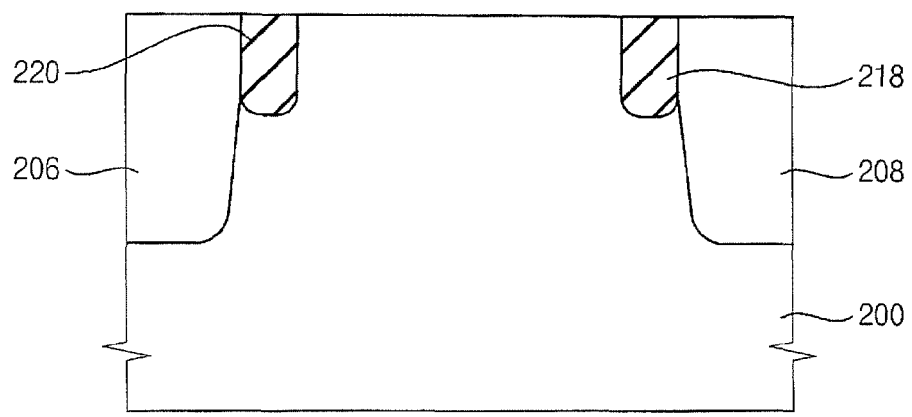
FIGS. 22 and 23 are cross-sectional views illustrating a non-volatile memory device and fabrication methods thereof in accordance with third embodiments of the present invention.
Figure 23:
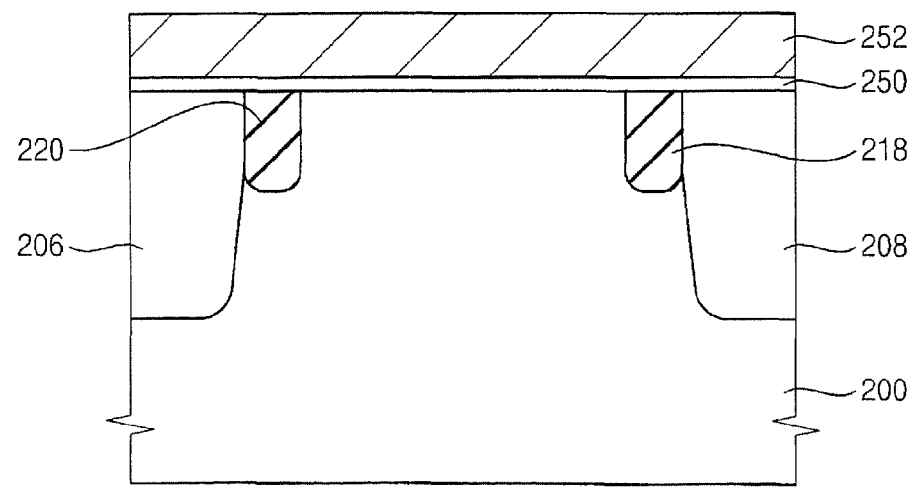

FIGS. 22 and 23 are cross-sectional views illustrating a method of manufacturing a non-volatile memory device in accordance with third embodiments of the present invention and devices so manufactured.

The methods of manufacturing the non-volatile memory device according to third embodiments as described below can be substantially the same as that of the second embodiments illustrated in FIGS. 12 to 18 except for processes for forming a gate oxide layer pattern and a gate electrode. Thus, any repetitive explanations thereof will be omitted herein for brevity.

First, processes substantially the same as those already described with reference to FIGS. 12 to 18 are performed to form a structure illustrated in FIG. 18.

Referring to FIG. 22, the sacrificial layer pattern 202a, the second hard mask pattern 212 and the protection pattern 210 are removed until upper faces of the substrate 200 and the variable resistance material layer pattern 218 are exposed. For example, the sacrificial layer pattern 202a, the second hard mask pattern 212 and the protection pattern 210 may be removed by a wet etching process.

Although not illustrated in figures, the sacrificial layer pattern 202a, the second hard mask pattern 212 and the protection pattern 210 may be removed by a CMP process prior to the removing process.

Referring to FIG. 23, a gate oxide layer 250 is formed on the substrate 200 and the variable resistance material layer pattern 218. In one embodiment, the gate oxide layer 250 may include a material such as silicon oxide. In another embodiment, the gate oxide layer 250 may include metal oxide having a dielectric constant higher than that of silicon oxide. Such a gate oxide layer 250 including a metal oxide material may be formed by an MOCVD process, an ALD process, or the like.

A gate conductive layer for forming a gate electrode is formed on the gate oxide layer 250. In some embodiments, the gate conductive layer may include polysilicon doped with impurities. In other embodiments, the gate conductive layer may include a metal.

A third hard mask pattern is formed on the gate conductive layer, and then, the gate conductive layer is patterned using the third hard mask pattern as an etching mask to form a gate electrode 252. The gate electrode 252 covers a portion of the substrate 200 between the variable resistance material layer patterns 218. Additionally, the gate electrode 252 may cover the first and the second impurity regions 206 and 208.

The second and third embodiments of the present invention may be employed in a non-volatile memory device having a cell array of a NOR type.

In non-volatile memory devices in accordance with the second and third embodiments, data may be written by changing resistance of the variable resistance material layer pattern according to the word line voltage. The data may be read by using a path of current flowing in each cell that varies according to resistance of the variable resistance material layer pattern. Accordingly, when the path of current flowing is elongated, a current is reduced relatively.

In non-volatile memory devices in accordance with various embodiments, the metal filaments are formed along the grain boundaries in the variable resistance material layer pattern, so that resistance distribution of the variable resistance material layer according to the voltage applied to the gate electrode may be uniform. Accordingly, operation characteristics of the non-volatile memory device may be improved.

In summary, non-volatile memory devices according to various embodiments of the present invention may have improved operation characteristics due to a reduced interference between adjacent cells and a uniform resistance distribution. Further, the non-volatile memory devices may be capable of operating at a relatively low voltage, and also may be employed in a non-volatile memory device having a cell array of a NAND type or a NOR type and highly integrated. Accordingly, methods of manufacturing non-volatile memory devices according to various embodiments of the present invention may result in a low cost and a high efficient process for manufacturing non-volatile memory devices.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing an integrated circuit non-volatile memory device, the method comprising:
    forming a recess in an integrated circuit substrate;
    forming a variable resistance material layer on surfaces of the recess, the variable resistance material layer including a plurality of grains therein that define grain boundaries between the grains;
    implanting metal ions into the variable resistance material layer to form metal filaments along at least some of the grain boundaries in the variable resistance material layer;
    forming a lower electrode on the variable resistance material layer in the recess;

forming a dielectric layer on the substrate, the variable resistance material layer and the lower electrode; and forming an upper electrode on the dielectric layer, the upper electrode overlapping the variable resistance material layer and the lower electrode.

2. The method of claim 1, wherein forming the lower electrode comprises:

forming a conductive layer in the recess; and planarizing the conductive layer and the variable resistance material layer until the substrate is exposed.

3. The method of claim 1, wherein the variable resistance material layer comprises metal oxide.

4. The method of claim 3, wherein the variable resistance material layer comprises nickel oxide, zirconium oxide, titanium oxide, niobium oxide, lead oxide and/or tantalum oxide.

5. The method of claim 1, further comprising forming impurity regions in portions of the substrate adjacent to the upper electrode.

6. The method of claim 1, wherein the metal ion comprises a nickel ion.

7. A method of claim 1:

wherein forming a recess is preceded by forming an isolation layer pattern extending in a first direction in the integrated circuit substrate to define an active region and an isolation region of the substrate;

wherein forming a recess comprises forming a plurality of recesses by partially removing the active region of the substrate;

wherein forming a variable resistance material layer comprises forming a variable resistance material layer on surfaces of the recesses, the variable resistance material layer including a plurality of grains therein that define grain boundaries between the grains; and wherein forming a lower electrode comprises forming a lower electrode extending in a second direction substantially perpendicular to the first direction on the variable resistance material layer in the recess.

8. A method of manufacturing an integrated circuit nonvolatile memory device comprising:

forming a recess in an integrated circuit substrate;

forming a variable resistance layer on surfaces of the recess, the variable resistance layer including a plurality of grains therein that define grain boundaries between the grains;

forming conductive filaments along at least some of the grain boundaries; and forming an electrode on the variable resistance layer.

9. The method of claim 8 wherein forming conductive filaments along at least some of the grain boundaries comprises implanting conductive ions into at least some of the grain boundaries.

10. The method of claim 8 wherein the variable resistance layer comprises a variable resistance oxide of a metal and wherein the conductive filaments comprise the metal.

* * * * *